US007879183B2

(12) United States Patent
Yousif et al.

(10) Patent No.: US 7,879,183 B2
(45) Date of Patent: Feb. 1, 2011

(54) APPARATUS AND METHOD FOR FRONT SIDE PROTECTION DURING BACKSIDE CLEANING

(75) Inventors: Imad Yousif, San Jose, CA (US); Ying Rui, Santa Clara, CA (US); Nancy Fung, Livermore, CA (US); Martin Jeffrey Salinas, San Jose, CA (US); Ajit Balakrishna, Sunnyvale, CA (US); Anchel Sheyner, San Francisco, CA (US); Shahid Rauf, Pleasanton, CA (US); Walter R. Merry, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 71 days.

(21) Appl. No.: 12/038,499

(22) Filed: Feb. 27, 2008

(65) Prior Publication Data

US 2009/0214798 A1 Aug. 27, 2009

(51) Int. Cl.
*H01L 21/306* (2006.01)
*C23C 16/00* (2006.01)
*C23C 16/455* (2006.01)

(52) U.S. Cl. ............................ 156/345.34; 156/345.33; 118/715

(58) Field of Classification Search ....................... None
See application file for complete search history.

(56) References Cited

U.S. PATENT DOCUMENTS 5,024,748 A * 6/1991 Fujimura ............... 204/298.38
5,792,272 A * 8/1998 van Os et al. ............ 118/723 R
5,819,684 A * 10/1998 Hawkins et al. ............. 118/715
5,851,294 A * 12/1998 Young et al. ................ 118/715
6,406,589 B1 * 6/2002 Yanagisawa ............. 156/345.3
6,852,167 B2 * 2/2005 Ahn .......................... 118/715
6,872,258 B2 * 3/2005 Park et al. ................... 118/715
2003/0033979 A1 * 2/2003 Kholodenko et al. ........ 118/715
2003/0143820 A1 * 7/2003 Martin et al. ............... 438/465
2004/0099377 A1 * 5/2004 Newton et al. ......... 156/345.33
2004/0134611 A1 * 7/2004 Kato et al. ............. 156/345.33
2006/0021636 A1 * 2/2006 Miya .......................... 134/33
2006/0174827 A1 * 8/2006 Bae et al. .................... 117/200

OTHER PUBLICATIONS

Grubbs et al., "Attenuation of Hydrogen Radicals Traveling Under Flowing Gas Conditions Through Tubes of Different Materials."J. Vac. Sci. Technol. A 24(3), May/Jun. 2006, pp. 486-496.

* cited by examiner

*Primary Examiner*—Jeffrie R Lund
(74) *Attorney, Agent, or Firm*—Patterson & Sheridan, LLP

(57) ABSTRACT

Embodiments of the present invention provide apparatus and method for front side protection while processing side and backside of a substrate. One embodiment of the present invention provides a showerhead configured to provide a purge gas to a front side of a substrate during a backside etch processing. The showerhead comprises a body configured to be disposed over the front side of the substrate. The body has a process surface configured to face the front side of the substrate. The process surface has an outer circular region, a central region, a middle region between the outer central region and the central region. The first plurality of holes are distributed in the outer circular region and configured to direct the purge gas towards an edge area of the front side of the substrate. No gas delivery hole is distributed within a substantial portion of the middle region.

25 Claims, 8 Drawing Sheets

106a
105
110
107a
108a
106
119
118
107
108

APPARATUS AND METHOD FOR FRONT SIDE PROTECTION DURING BACKSIDE CLEANING

BACKGROUND

1. Field

Embodiments of the present invention generally relate to method and apparatus for processing a semiconductor substrate. More particularly, embodiments of the present invention provide method and apparatus for backside cleaning.

2. Description of the Related Art

During semiconductor processing, edge and backside of a substrate sometimes need to be cleaned of any byproducts from processes target on the front side of the substrate. One of the challenges for cleaning the side and backside is to keep the front side from being damaged.

A purge gas is generally flown to the front side to reduce any damages to the front side from the active species. However, conventional apparatus and methods do not provide enough protection to the front side of the substrate.

Therefore, there is a need for apparatus and method for front side protection during side and backside cleaning.

SUMMARY

Embodiments of the present invention generally provide apparatus and methods for backside processing of a semiconductor substrate. Particularly, embodiments of the present invention provide apparatus and method for front side protection while processing the bevel backside of a substrate.

One embodiment of the present invention provides a showerhead configured to provide a purge gas to a front side of a substrate during a backside etch processing. The showerhead comprises a body configured to be disposed over the front side of the substrate. The body has a process surface configured to face the front side of the substrate. The process surface has an outer circular region, a central region, a middle region between the outer central region and the central region. The first plurality of holes are distributed in the outer circular region and configured to direct the purge gas towards an edge area of the front side of the substrate. No gas delivery hole is distributed within a substantial portion of the middle region.

Another embodiment of the present invention provides a method for cleaning a backside of a substrate. The method comprises positioning the substrate on a substrate support with an edge region of the substrate over hanging the substrate support, wherein a front side of the substrate is facing up and the backside of the substrate partially contacts the substrate support. The method further comprises directing a purge gas towards outer regions of the front side, wherein the outer regions comprise an outer circular region near an edge of the substrate, and flowing a processing gas towards the backside of the substrate.

Yet another embodiment of the present invention provides an apparatus for processing a substrate. The apparatus comprises a chamber body defining a processing volume, and a substrate support disposed in the processing volume, wherein the substrate support is configured to support the substrate on a backside while exposing an edge region of the substrate. The apparatus further comprises a showerhead disposed over the substrate support, wherein the showerhead has a first plurality of holes configured for gas delivery, the first plurality of holes are distributed in an outer circular region corresponding to an edge area of a front side of the substrate, no gas delivery hole is distributed within a middle region radially inward of the first plurality of holes, and the middle region corresponds to a substantial surface area of the front side.

BRIEF DESCRIPTION OF THE DRAWINGS

So that the manner in which the above recited features of embodiments of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

A backside polymer removal process is usually performed after dielectric etch process treatments to remove undesired backside polymer. During the backside polymer removal process, active chemical species are injected from a remote plasma source through a nozzle. The active species impinges on the side and backside of the substrate chemically attacking and removing the polymer deposited thereon. However, the active species also damage sensitive device structures, such as low k dielectric structures, on the front side of the substrate.

Embodiments of the present invention generally provide apparatus and method for backside cleaning with improved front side protection. In one embodiment, a showerhead with patterned holes is used for flowing a purge gas towards restricted region of a front side of a substrate while a back side is cleaned. In another embodiment, a distance between a showerhead for distributing a purge gas and a substrate front surface is reduced to improve front side protection. In another embodiment, recombination coefficient of a showerhead is increased to improve front side protection from radical species used to clean the backside. Yet in another embodiment, a recess is formed in a showerhead configured to distribute a purge gas to form a small gap between the showerhead and the substrate near an outer edge of the substrate for improved front side protection.

Figure 1:
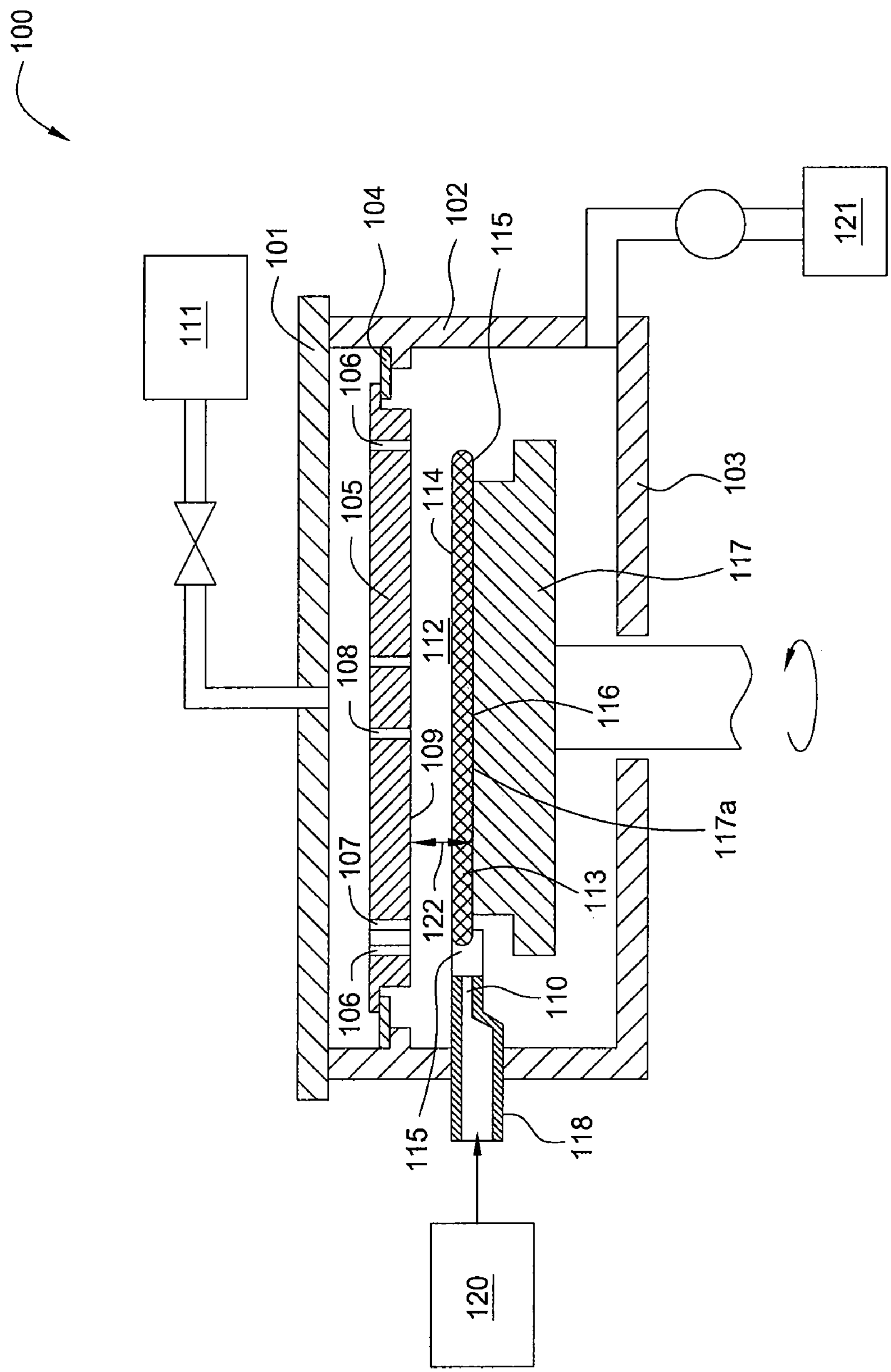
FIG. 1 is a schematic sectional side view of a processing chamber in accordance with one embodiment of the present invention.

FIG. 1 is a schematic sectional side view of a processing chamber 100 in accordance with one embodiment of the present invention. The processing chamber 100 is configured to remove byproducts from side and backside of an edge region of a substrate.

The processing chamber 100 generally comprises a lid 101, chamber walls 102 and a chamber bottom 103, which define a processing volume 112 configured to process a substrate 113 therein. A substrate support 117 is disposed in the processing volume 112 configured to support the substrate 113 on a supporting surface 117*a*. The supporting surface 117*a* is smaller than the substrate 113. During processing, the substrate 113 may be disposed on the substrate support 117 with a front side 114 facing up and a backside 116 contacting the supporting surface 117*a*. An edge portion 115 extends from the supporting surface 117*a* exposing backside of the edge portion 115 to the processing volume 112. In one embodiment, the substrate support 117 may be configured to rotate the substrate 113 during processing. The substrate support 117 may also secure the substrate 113 during processing. In one embodiment, the substrate support 117 comprises an electrostatic chuck.

The processing chamber 100 further comprises an injection nozzle 118 configured to direct processing gases towards the processing volume 112 to process the edge portion 115. In one embodiment, the injection nozzle 118 may be disposed on one side of the chamber wall 102 with one or more injecting ports 110 directing towards a portion of the substrate 113. In one embodiment, the injection nozzle 118 is connected to a remote plasma source 120 and is configured to deliver plasma of processing gases to the processing volume 112, as described in more detail with FIGS. 5A-5D.

Referring to FIG. 1, a showerhead 105 is disposed in the processing volume 112 and configured to supply a purge gas to protect the front side 114 of the substrate 113 from the processing gases from the injection nozzle during processing. The showerhead 105 may be mounted on a mounting ring 104 coupled to the chamber walls 102. The showerhead 105 is configured to deliver a purge gas from a gas source 111 to the processing volume 112. In one embodiment, the showerhead 105 has a plurality of holes configured to deliver the purge gas towards selected regions over the substrate 113 to improve front side protection.

In one embodiment, a gap 122 between a contact surface 109 of the showerhead 105 and the supporting surface 117*a* may be adjusted to improve protection of the front side 114 of the substrate 113 and maintain a desired processing rate, e.g. etching rate. In one embodiment, the gap 122 may be reduced for improved protection.

The processing chamber 100 further comprises a vacuum system 121 connected to the processing volume 112 and configured to pump the processing volume 112 during processing.

Figure 2:
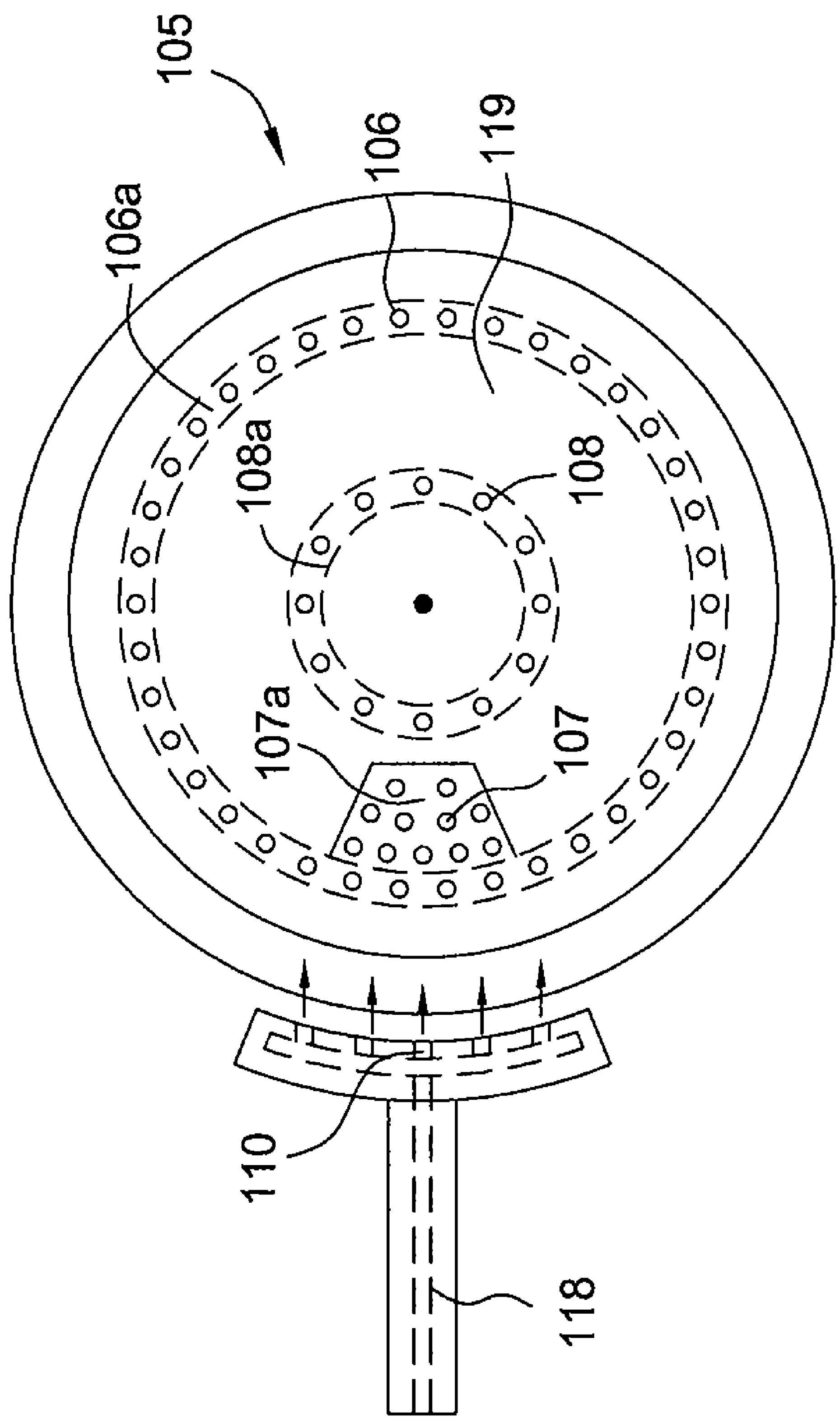
FIG. 2 is a schematic bottom view of a showerhead in accordance with one embodiment of the present invention.

FIG. 2 is a schematic bottom view of the showerhead 105 in accordance with one embodiment of the present invention. As shown in FIG. 2, the plurality of holes 106, 107, 108 are patterned to provide better protection to the front side 114 of the substrate 113 during processing. Unlike conventional showerheads which generally have a plurality of holes evenly distributed across a surface corresponding to a substrate surface for distributing processing gas and/or purge gas, the showerhead 105 has patterned gas delivery holes on selected regions with no holes disturbed on most of a middle portion 119 of the showerhead 105.

In one embodiment, the showerhead 105 has a first plurality of holes 106 distributed in an outer circular region 106*a* of the showerhead 105. During processing, the outer circular region 106*a* corresponds to an edge region of the substrate 113. The first plurality of holes 106 are configured to direct a purge gas to the front side 114 near the edge region of the substrate 113. The first plurality of holes 106 may be evenly distributed along the outer circular region 106*a*. In one embodiment, an outer diameter of the outer circular region 106*a* may be slightly smaller than an outer diameter of the substrate 113. As demonstrated in Examples described below, the showerhead 105 with gas delivery holes limited in the outer circular region 106*a* provides better protection to the front side 114 of the substrate 113 than a showerhead with gas delivery holes evenly distributed across an area corresponding to an entire surface of the substrate.

In one embodiment, the showerhead 105 has a second plurality of holes 108 distributed in a central region 108*a* of the showerhead 105 in addition to the first plurality of holes 106. The second plurality of holes 108 may be evenly distributed in the central region 108*a* and is configured to direct part of the purge gas toward a central region of the substrate 113 during processing. The second plurality of holes 108 may ensure that a purge gas sheath is formed above central and middle regions of the front side 114 of the substrate 113 wherein no gas delivery holes are directly disposed above.

In another embodiment, the showerhead 105 has a third plurality of holes 107 distributed in a port region 107*a* of the showerhead 105. The port region 107*a* is arranged near the injection nozzle 118 where the processing gases/plasma are injected into the processing volume 112. The third plurality of holes 107 provides additional purge gas near the injection nozzle 118 wherein the processing gas has its highest concentration. The port region 107*a* may be overlapping with the outer circular region 106*a* and occupying a portion of the middle portion 119. In one embodiment, the middle portion 119 may occupy about 75% of the contact surface 109 of the showerhead 105.

During processing, radical species injected with the processing gases from the injection nozzle 118 may move against the flow direction of the purge gas from the showerhead 105 by way of diffusion. In one embodiment of the present invention, the showerhead 105 is made to promote surface recombination of radical species to reduce damage to the front side 114 from the diffused radical species. Material of the entire showerhead 105 or the contact surface 109 of the showerhead 105 may be chosen or treated to promote surface recombination of chemically active species that are injected to the processing volume 112 from the injection nozzle 118 to process the edge and backside of the edge portion 115. Radicals in a plasma are generally considered chemically active species. The radicals, or chemically active species, may be absorbed to a surface and recombine into chemically inactive molecules.

In one embodiment, the showerhead 105 is designed to increase absorption of the chemically active species and deactivate the chemically active species to protect the front side 114 of the substrate 113.

In one embodiment, the showerhead 105 may be made from materials with high recombination coefficient. A recombination coefficient indicates a rate of surface recombination. The showerhead 105 may be made from aluminum, quartz (fused silica), anodized aluminum, ceramic (such as aluminum oxide, and others), silicon carbide, stainless steel, or combinations thereof.

In another embodiment, surfaces of the showerhead 105 that may contact with the processing gas are treated to promote surface recombination. In one embodiment, the surfaces of the showerhead 105 that may contact with the processing gas are treated by mechanical roughening.

Figure 3:
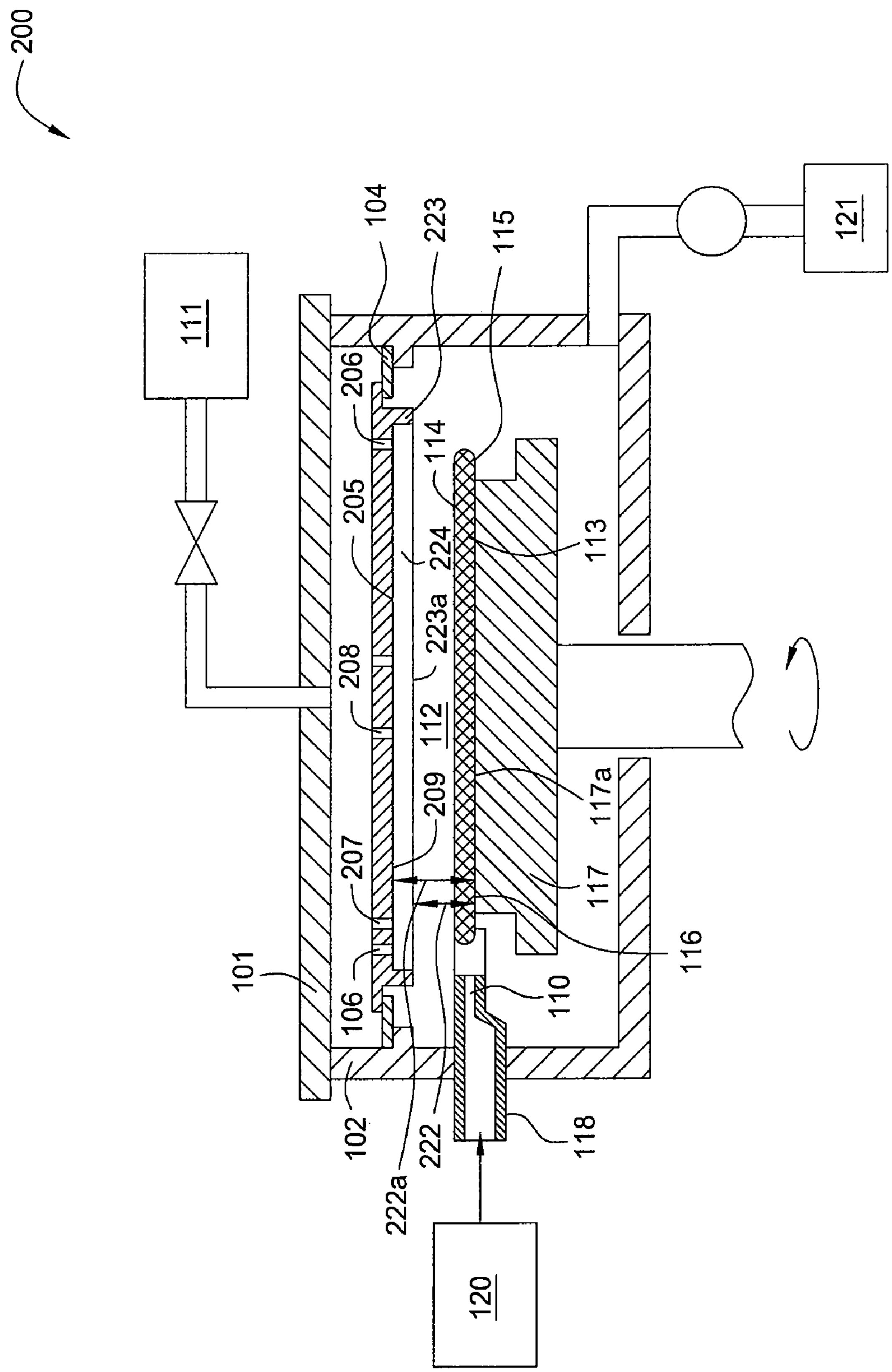
FIG. 3 is a schematic sectional side view of a processing chamber in accordance with another embodiment of the present invention.

FIG. 3 is a schematic sectional side view of a processing chamber 200 in accordance with another embodiment of the present invention. The processing chamber 200 is similar to the processing chamber 100 of FIG. 1 except that the processing chamber 200 comprises a showerhead 205 which is different from the showerhead 105 of the processing chamber 100.

The showerhead 205 is disposed in the processing volume 112 and configured to supply a purge gas to protect the front side 114 of the substrate 113 from the processing gases from the injection nozzle during processing. The showerhead 205 has a circular shoulder 223 extending from the body of the showerhead 205. The circular shoulder 223 forms a circular recess 224. Patterned gas delivery holes 206, 207, 208 are distributed on a bottom surface 209 of the recess 224.

In one embodiment, the circular shoulder 223 has a diameter similar to the diameter of the substrate 113 being processed in the processing chamber 200. A bottom surface 223*a* may be even. The circular shoulder 223 of the showerhead 222 produces a varied gap between the substrate 113 and the showerhead 205. A gap 222 is formed between the backside 116 of the substrate 113 and the bottom surface 209 of the recess 224 at inner regions of the substrate 113. A narrow gap 222*a* is formed between the backside 116 of the substrate 113 and the bottom surface 223*a* of the circular shoulder 223 around the edge region 115 of the substrate 113. It has been shown that the narrow gap 222*a* promotes improved protection to the front side 114 in some processing conditions.

Figure 4:
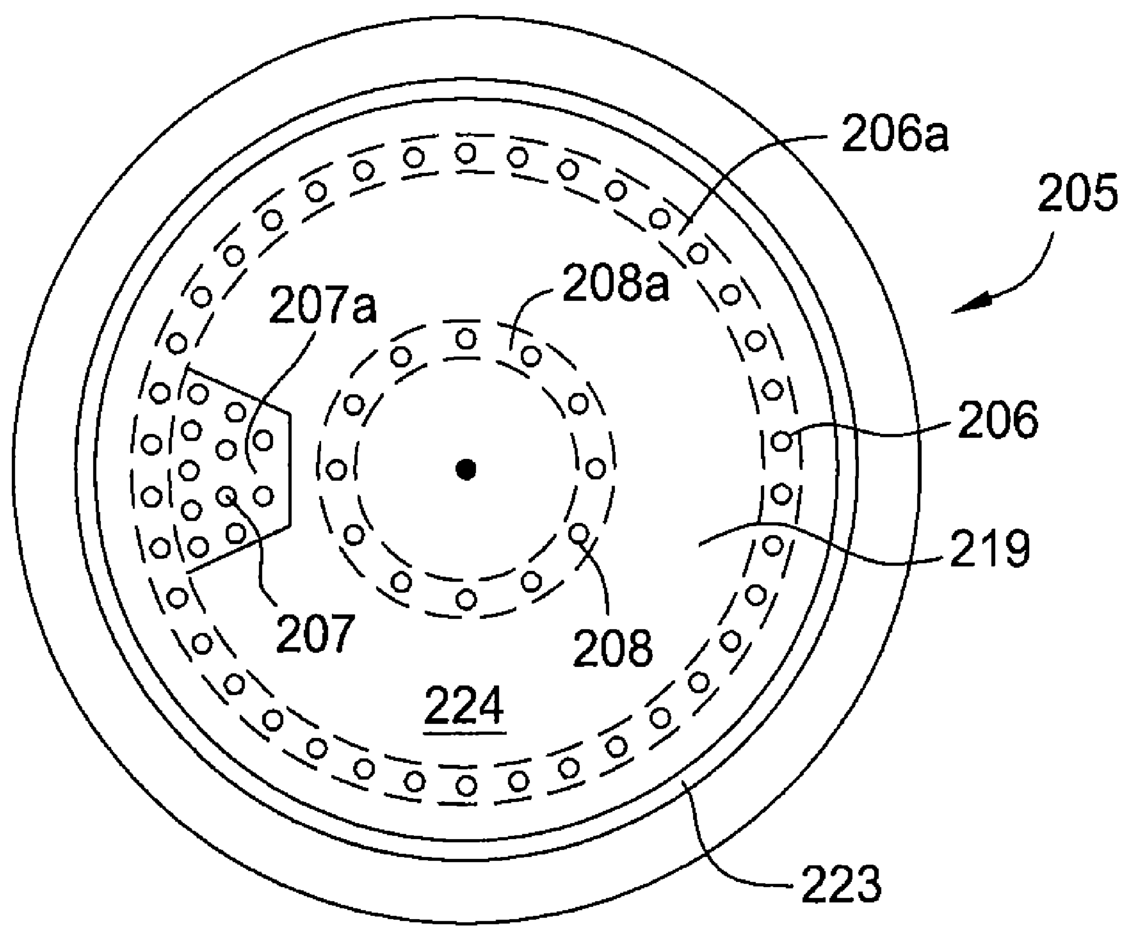
FIG. 4 is a schematic bottom view of a showerhead in accordance with one embodiment of the present invention.

FIG. 4 is a schematic bottom view of the showerhead 205 of FIG. 3. As shown in FIG. 4, the plurality of holes 206, 207, 208 are formed in the bottom surface 209 and are patterned to provide better protection to the front side 114 of the substrate 113 during processing. The showerhead 205 has patterned gas delivery holes on selected regions with no holes disturbed on most of a middle portion 219 of the showerhead 205.

In one embodiment, the showerhead 205 has a first plurality of holes 206 distributed in an outer circular region 206*a* of the showerhead 205. In one embodiment, the showerhead 205 has a second plurality of holes 208 distributed in a central region 208*a* of the showerhead 205 in addition to the first plurality of holes 206. The second plurality of holes 208 may be evenly distributed in the central region 208*a* and is configured to direct part of the purge gas toward a central region of the substrate 113 during processing. In another embodiment, the showerhead 205 has a third plurality of holes 207 distributed in a port region 207*a* of the showerhead 205. The port region 207*a* is arranged near the injection nozzle 118 where the processing gases/plasma are injected into the processing volume 112.

Embodiments of the present invention have proofed to improve front side protection. The following examples have been performed to demonstrate improved front side protection in accordance with embodiments of the present invention.

The process used in the examples is to remove backside polymer from substrates having features formed from low-k dielectric materials on front sides. The backside polymer is removed using a plasma of a processing gas comprising hydrogen and water vapor. A purge gas comprising nitrogen is delivered from a showerhead disposed over the front side of the substrate to protect the low-k features on the front side. Damages to the front side low-k dielectric are measured by comparing features sizes after removal of a photoresist layer for substrates with and without the backside polymer removal process. For example, if a trench formed in a low-k dielectric is measured 120 nm in width without the removal process and 130 nm in width with the removal process, a 5 nm loss is imposed to the low-k dielectric by the backside polymer removal process.

Substrates being processed in the examples had low-k dielectric structures formed on front sides, and an average between about 450 nm and 550 nm polymer formed on sides and backsides near edge regions of the substrates. The substrates were then disposed in a process chamber to remove the polymer for different settings. The process chamber used is similar to the process chambers 100, 200 with different showerhead designs and/or different flow rates. Damages to the low-k dielectric and polymer removal rates were then measured and compared.

FIGS. 5A-5D schematically illustrate injection nozzles 118*a*, 118*b*, 118*c*, 118*d* in accordance with different embodiments of the present invention. Each of the injection nozzles 118*a*, 118*b*, 118*c*, 118*d* may be used as the injection nozzle 118 in the processing chamber 100 of FIG. 1 to improve front side protection. In one embodiment, the injection nozzle 118 may be moved away from the substrate to improve front side protection. In another embodiment, the flow of the processing gas may be divided into a plurality of sub-flows along a significant portion of the edge of the substrate, such as using the injection nozzle 118*b* of FIG. 5B, to improve front side protection. In another embodiment, the flow of the processing gas may be directed to be tangential to the substrate, such as using the injection nozzle 118*c* of FIG. 5C, to improve front side protection.

Figure 5A:
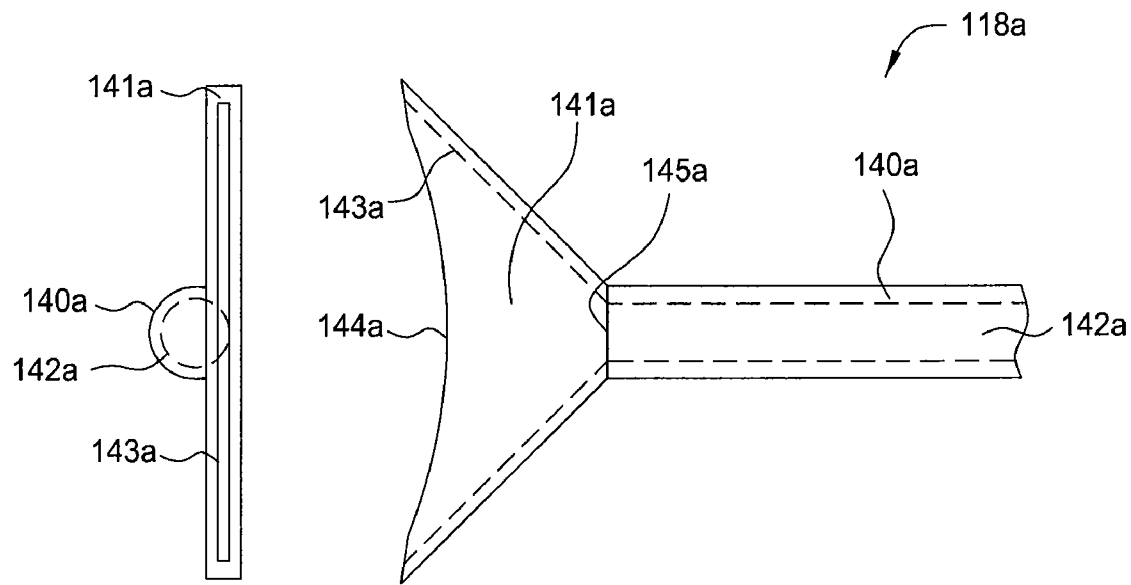
FIGS. 5A-5D schematically illustrate injection nozzles in accordance with different embodiments of the present invention.

FIG. 5A schematically illustrates the injection nozzle 118*a* in accordance with one embodiment of the present invention. The injection nozzle 118*a* comprises an input pipe 140*a* having an input channel 142*a* coupled to a nozzle head 141*a* having an injection port 143*a*. The input channel 142*a* is in fluid communication with the injection port 143*a*. The injection nozzle 118*a* is configured to deliver a processing gas from a gas source through the input channel 142*a* and the injection port 143*a* to a processing chamber.

The nozzle head 141*a* has a substantially flat shape and is configured to deliver the processing gas to a vertically narrow region corresponding to the edge region to be processed. The nozzle head 141*a* has a narrow end 145*a* connecting to the input pipe 140*a* and a curved wide end 144*a* configured to arc around a portion of the substrate being processed. The injection port 143*a* has a wide opening along the curved wide end 144*a*.

Figure 5B:
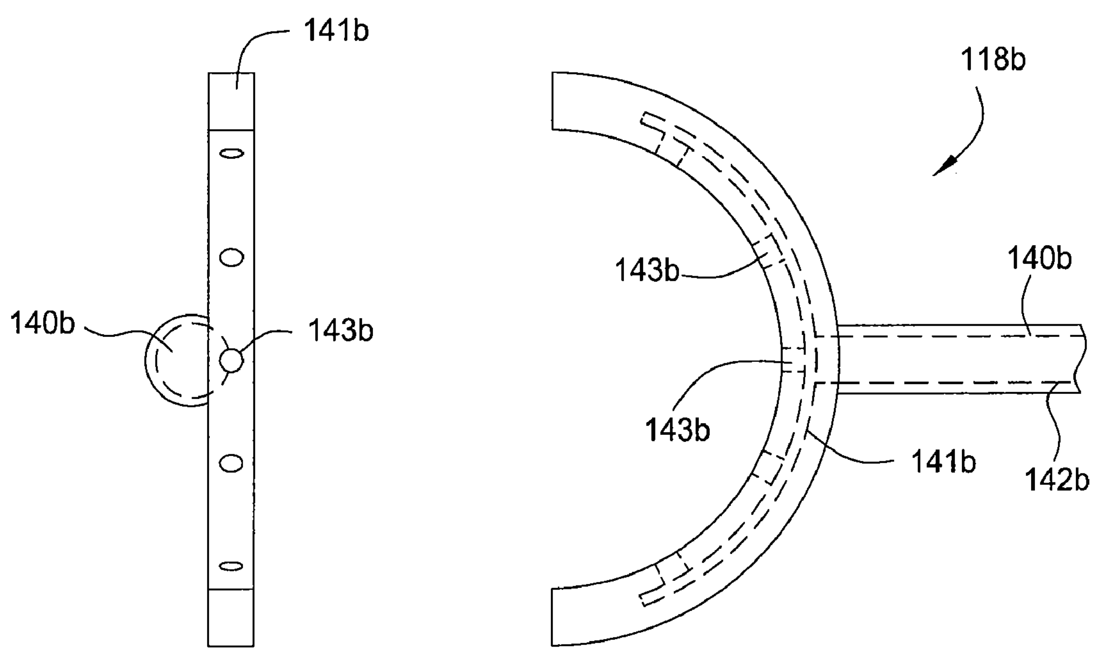

FIG. 5B schematically illustrates the injection nozzle 118*b* in accordance with one embodiment of the present invention. The injection nozzle 118*b* comprises an input pipe 140*b* having an input channel 142*b* coupled to a nozzle head 141*b* having a plurality of injection ports 143*b*. The input channel 142*b* is in fluid communication with the plurality of injection ports 143*b*. The injection nozzle 118*b* is configured to deliver a processing gas from a gas source through the input channel 142*b* and the plurality of injection ports 143*b* to a processing chamber.

The nozzle head 141*b* has a substantially flat shape and is configured to deliver the processing gas to a vertically narrow region corresponding to the edge region to be processed. The nozzle head 141*b* has an arced body connecting to the input pipe 140*b*. The nozzle head 141*b* curves around a portion of the substrate being processed. Each of the plurality of injection ports 143*b* is a small through hole. The plurality of injection ports 143*b* are evenly distributed along the nozzle head 141*b*.

Figure 5C:
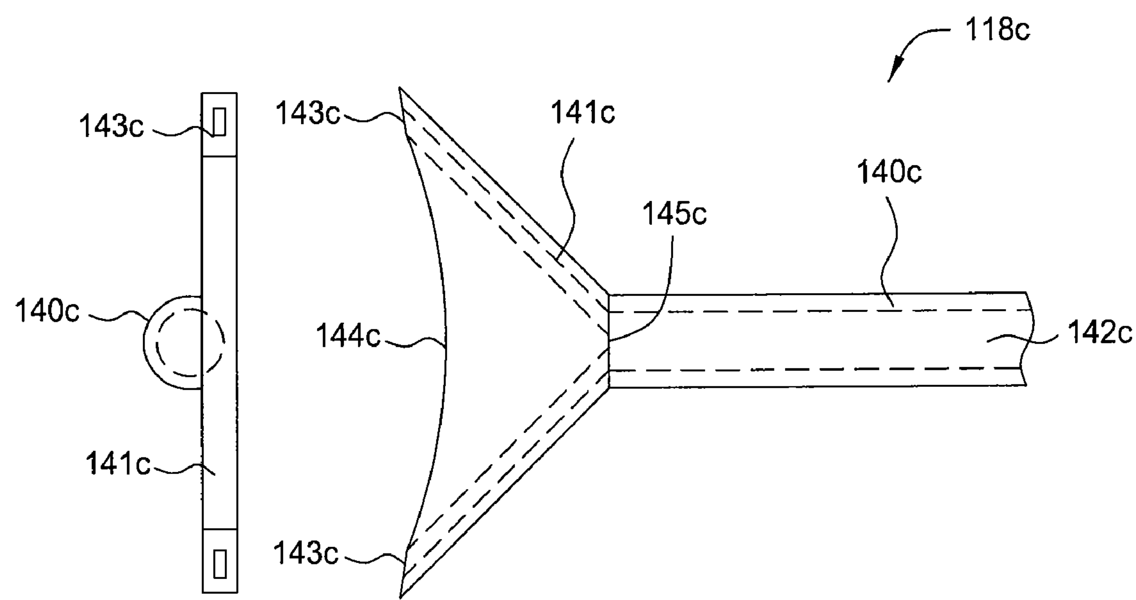

FIG. 5C schematically illustrates the injection nozzle 118*c* in accordance with one embodiment of the present invention. The injection nozzle 118*c* comprises an input pipe 140*c* having an input channel 142*c* coupled to a nozzle head 141*c* having two injection ports 143*c*. The input channel 142*c* is in fluid communication with the injection ports 143*c*. The injection nozzle 118*c* is configured to deliver a processing gas from a gas source through the input channel 142*c* and the injection ports 143*c* to a processing chamber.

The nozzle head 141*c* has a substantially flat shape and is configured to deliver the processing gas to a vertically narrow region corresponding to the edge region to be processed. The nozzle head 141*c* has a narrow end 145*c* connecting to the input pipe 140*c* and a curved wide end 144*c* configured to arc around a portion of the substrate being processed. The injection ports 143*c* are forked from the input channel 142*c* and exit from opposite ends of the curved wide end 144*c* of the nozzle head 141*c*. Processing gas injected from the injection ports 143*c* flows substantially tangentially to a substrate being processed.

Figure 5D:
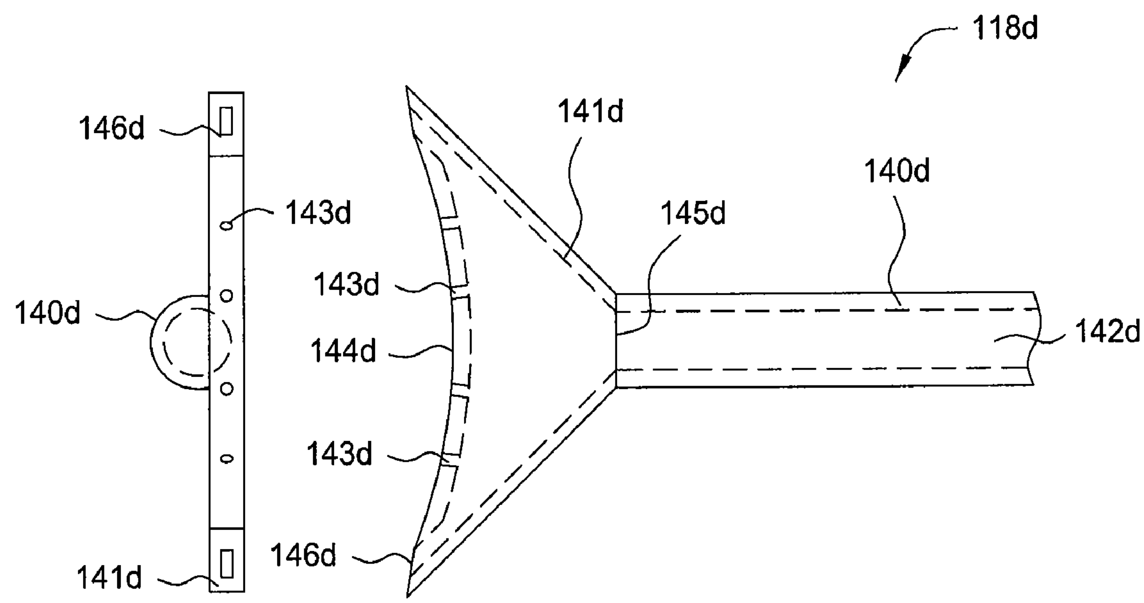

FIG. 5D schematically illustrates the injection nozzle 118*d* in accordance with one embodiment of the present invention. The injection nozzle 118*d* comprises an input pipe 140*d* having an input channel 142*d* coupled to a nozzle head 141*d* having injection ports 143*d*, 146*d*. The input channel 142*d* is in fluid communication with the injection ports 143*d*, 146*d*. The injection nozzle 118*d* is configured to deliver a processing gas from a gas source through the input channel 142*d* and the injection ports 143*d* to a processing chamber.

The nozzle head 141*d* has a substantially flat shape and is configured to deliver the processing gas to a vertically narrow region corresponding to the edge region to be processed. The nozzle head 141*d* has a narrow end 145*d* connecting to the input pipe 140*d* and a curved wide end 144*d* configured to arc around a portion of the substrate being processed. The injection ports 146*d* exit from opposite ends of the curved wide end 144*d* of the nozzle head 141*d*. Processing gas injected from the injection ports 143*d* flows substantially tangentially to a substrate being processed. The injection ports 143*d* are evenly distributed along the wide curved end 144*d* of the nozzle head 141*d*.

Figure 6:
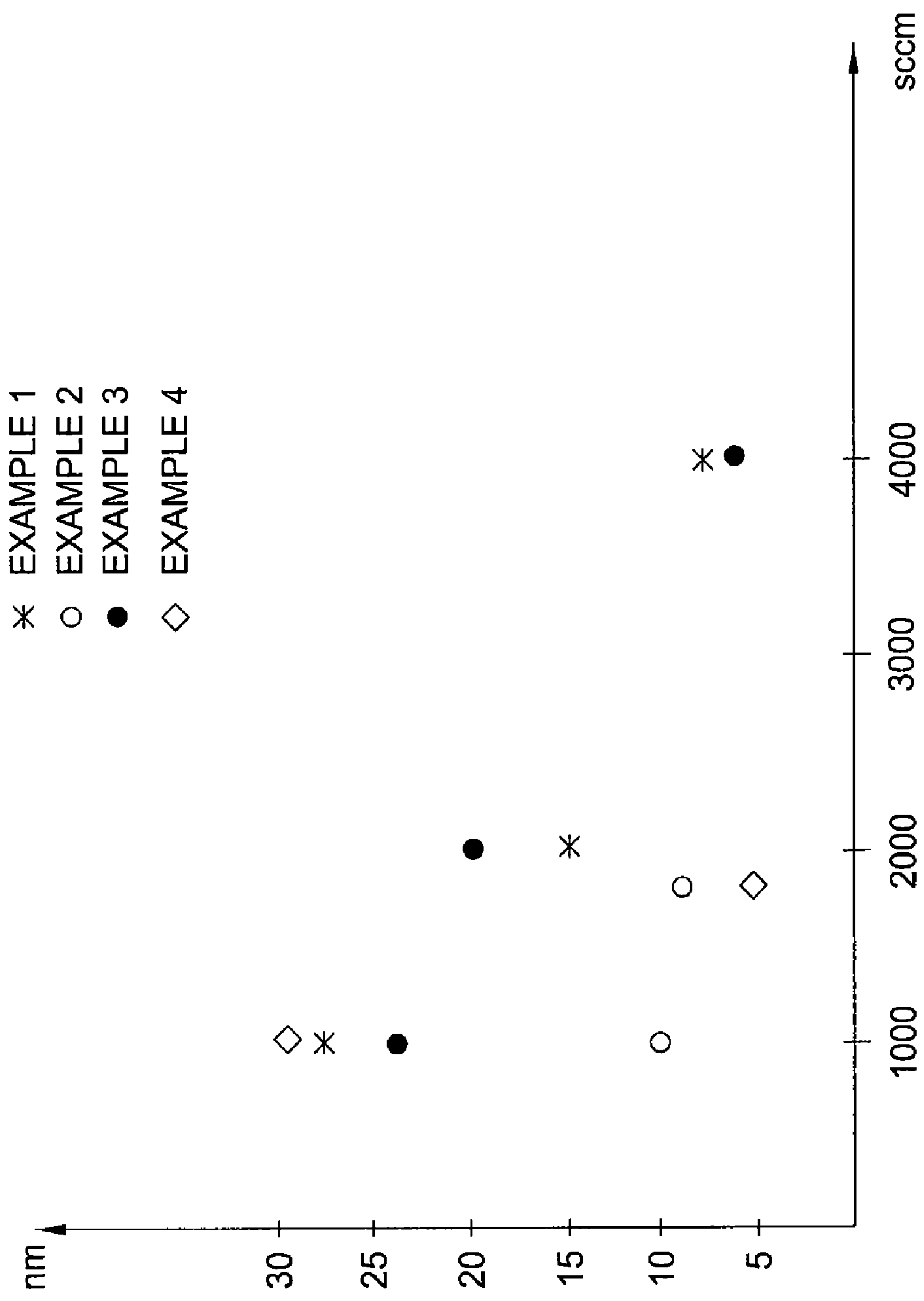
FIG. 6 is a schematic chart showing front side protection results in accordance with embodiments of the present invention.
Figure 7:
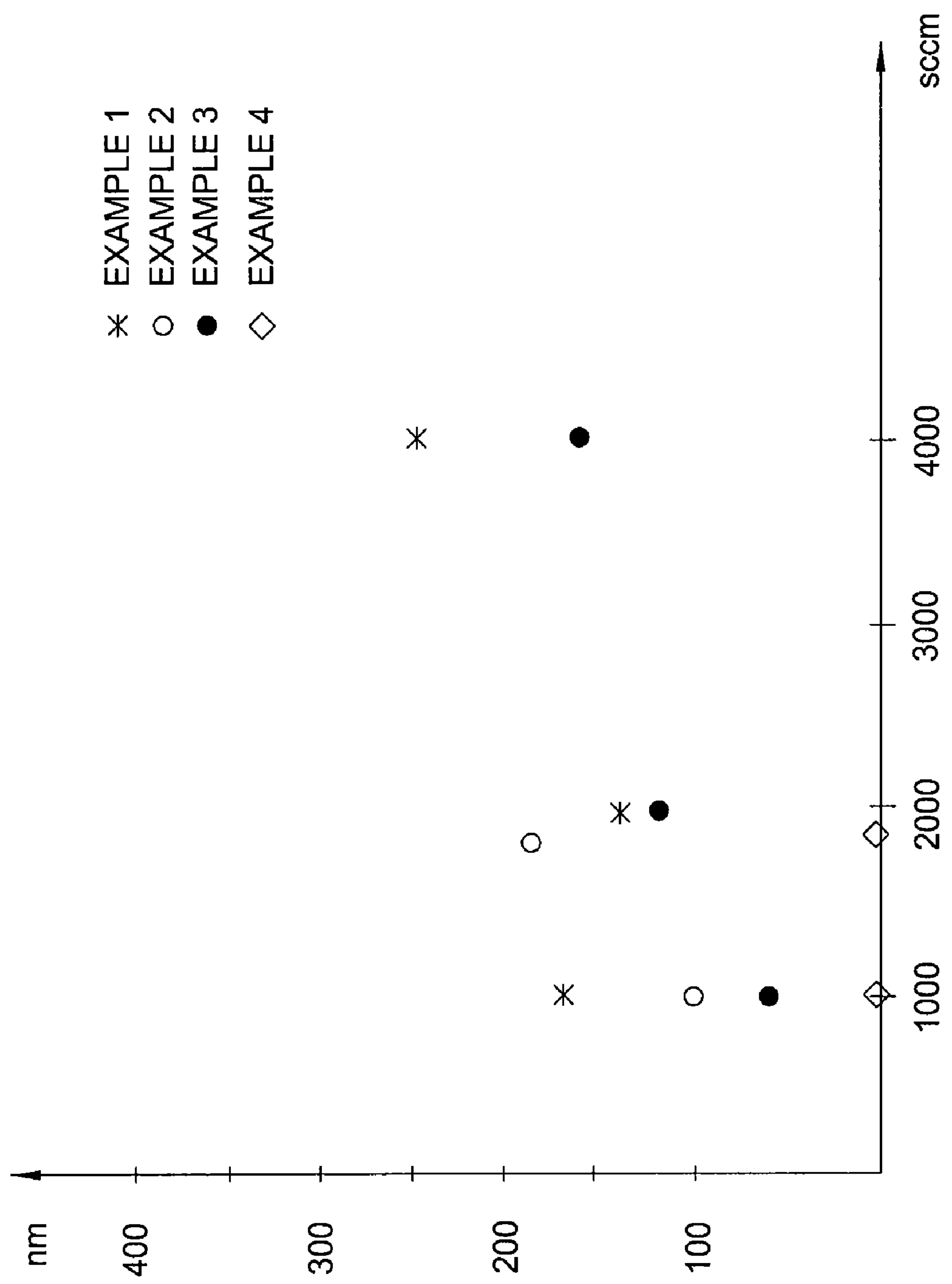
FIG. 7 is a schematic chart showing results of removal rates in process examples performed in accordance with embodiments of the present invention.

FIG. 6 is a schematic chart showing front side protection results in process examples performed in accordance with embodiments of the present invention. FIG. 7 is a schematic chart showing results of removal rates in process examples performed in accordance with embodiments of the present invention.

EXAMPLE 1

The processing chamber used in Example 1 is similar to the processing chamber 100 with a showerhead having a plurality of gas delivery holes evenly distributed across a surface corresponding to a front side of the substrate being processed. The showerhead has a flat surface facing the substrate being processed. An injection nozzle similar to the injection nozzle 118*b* of FIG. 5B is used.

The substrates are subjected to a pre-heating process for about 45 seconds. During the pre-heating process, the chamber pressure is about 5 Torr, the substrate is rotated at about 4 RPM (rotation per minute), and hydrogen is provided to the chamber at a flow rate of about 1000 sccm.

Process parameters for the present example for the polymer removal process are as follows:

flow rate of hydrogen from the injection nozzle: about 2000 sccm;

flow rate of water vapor from the injection nozzle: about 30 sccm;

remote plasma power level: about 4500 Waits;

chamber pressure: about 2.2 Torr;

process temperature: about 280° C.;

substrate rotation rate: about 4 RPM;

processing time: about 30 seconds;

flow rate of Nitrogen from the showerhead: about 1000/2000/4000 sccm respectively.

The damages to front side low-k structure of Example 1 are schematically indicated by "*" in FIG. 6. As shown by these results, damages to the front side low-k structure can be reduced by increasing flow rate of the purge gas from a conventional showerhead.

FIG. 7 illustrates average thickness of remaining polymer on the backside of the substrate after the example processes. Higher average remaining thickness corresponding to lower polymer removal rate. The average thicknesses of remaining polymer after Example 1 are indicated by "*" in FIG. 7. As shown by these results, removal rate is slightly reduced from increased flow rate of purge gas.

EXAMPLE 2

Patterned Showerhead

The processing chamber used in Example 2 is similar to the processing chamber 100 with a showerhead having patterned gas delivery holes, such as the showerhead 105 described above. The showerhead has a flat surface facing the substrate being processed. An injection nozzle similar to the injection nozzle 118*b* of FIG. 5B is used.

Substrates are first pre-heated by the same pre-heating process described in Example 1.

Parameters for the subsequent polymer removal process are the same as described in Example 1, except the purge gas from the showerhead comprises: Nitrogen of about 1000/1800 sccm respectively.

The damages to front side low-k structure of Example 2 are schematically indicated by "○" in FIG. 6. As shown by these results, damages to the front side low-k structure can be reduced by increasing flow rate of the purge gas from a conventional showerhead.

Compared to the results from Example 1, the results of Example 2 have shown damages to the front side low-k structure can be greatly reduced by substituting a conventional showerhead with a patterned showerhead when other process parameters remain the same.

The average thicknesses of remaining polymer after Example 2 are indicated by "○" in FIG. 7. As shown by these results, removal rate is slightly reduced from increased flow rate of purge gas.

Compared to the results from Example 1, the results of Example 2 have shown removal rate at backside is not obviously effected by substituting a conventional showerhead with a patterned showerhead when other process parameters remain the same.

EXAMPLE 3

Non-Patterned Showerhead with Recess

The processing chamber used in Example 3 is similar to the processing chamber 200 with a showerhead with evenly distributed gas delivery holes formed in a recess, such as recess 224 of the showerhead 205 described above. The showerhead according to the present example may not have a pattern a previously described. The showerhead of the present example may have a plurality of gas delivery holes evenly distributed across a surface set in a recess. An injection nozzle similar to the injection nozzle 118*b* of FIG. 5B is used.

Substrates are first pre-heated by the same pre-heating process described in Example 1.

Parameters for the subsequent polymer removal process are the same as described in Example 1, with the purge gas from the showerhead comprises: Nitrogen of about 1000/2000/4000 sccm respectively.

The damages to front side low-k structure of Example 3 are schematically indicated by "●" in FIG. 6. As shown by these results, damages to the front side low-k structure can be reduced by increasing flow rate of the purge gas from a conventional showerhead.

However, compared to the results from Example 1, the results of Example 3 have shown damages to the front side low-k structure are not greatly effected by introducing a recess to a conventional showerhead alone when other process parameters remain the same.

The average thicknesses of remaining polymer after Example 3 are indicated by "●" in FIG. 7. As shown by these results, removal rate is slightly reduced from increased flow rate of purge gas.

Compared to the results from Example 1, the results of Example 3 have shown removal rate at backside is slightly increased by introducing a recess to a conventional showerhead when other process parameters remain the same.

EXAMPLE 4

Recessed and Patterned Showerhead

The processing chamber used in Example 4 is similar to the processing chamber 200 with a showerhead having patterned gas delivery holes formed in a recessed area, such as the showerhead 205 described above. An injection nozzle similar to the injection nozzle 118*b* of FIG. 5B is used.

Substrates are first pre-heated by the same pre-heating process described in Example 1.

Parameters for the subsequent polymer removal process are the same as described in Example 1, except the purge gas from the showerhead comprises: Nitrogen of about 1000/1800 sccm respectively.

The damages to front side low-k structure of Example 4 are schematically indicated by "◇" in FIG. 6. As shown by these results, damages to the front side low-k structure can be reduced by increasing flow rate of the purge gas from a conventional showerhead.

Compared to the results from Example 2, the results of Example 4 have shown damages to the front side low-k structure can be greatly reduced by patterning a recessed showerhead at certain purge gas flow rate when other process parameters remain the same.

Compared to the results from Example 3, the results of Example 4 have shown damages to the front side low-k structure can effected by patterning a recessed showerhead head when other process parameters remain the same.

The average thicknesses of remaining polymer after Example 4 are indicated by "◇" in FIG. 7. As shown by these results, removal rate are increased by using the patterned and recessed showerhead.

Compared to the results from Example 2, the results of Example 4 have shown removal rate at backside is increased by adding a shower and forming a recess in a patterned showerhead when other process parameters remain the same.

Compared to the results from Example 3, the results of Example 4 have shown removal rate at backside is increased by patterning a recessed showerhead when other process parameters remain the same.

Even though, an etching process is described in accordance with the embodiments described above, embodiments of the present invention may be applied to improve front protection to a substrate for any suitable processes.

While the foregoing is directed to embodiments of the present invention, other and further embodiments of the invention may be devised without departing from the basic scope thereof, and the scope thereof is determined by the claims that follow.

What is claimed is:

1. A showerhead configured to provide a purge gas to a front side of a substrate during a backside processing in a processing chamber, wherein the processing chamber includes an injection nozzle disposed in one side of a processing volume and the injection nozzle is configured for injecting a processing gas towards an edge region of the substrate, the showerhead comprising:

a body configured to be disposed over the front side of the substrate, wherein the body has:
- a bottom surface configured to face the front side of the substrate, wherein the bottom surface has an outer circular region, a central region, and a middle region between the outer circular region and the central region,
- a top surface opposing the bottom surface,
- a first plurality of holes distributed in the outer circular region and configured to direct the purge gas towards an edge area of the front side of the substrate,
- a plurality of port region holes distributed in a port region located on a portion of the outer circular region extending radially inward, wherein the port region is on one side of body and aligned with the injection nozzle, each of the first plurality holes and the plurality of port region holes is a through hole with a first opening at the bottom surface of the body and a second opening at the top surface of the body, and no hole is distributed within a substantial portion of the middle region, and
- a recess surrounded by a side wall extending from the body outside the first plurality of holes.

2. The showerhead of claim 1, wherein the body further has a second plurality of holes configured for gas delivery, and the second plurality of holes are distributed in the central region, and each of the second plurality of holes is a through hole with a first opening at the bottom surface of the body and a second opening at the top surface of the body.

3. The showerhead of claim 2, wherein the first plurality of holes are evenly distributed along a circle in single row, and the second plurality of holes are evenly distributed along a circle in single row.

4. The showerhead of claim 1, wherein the body is configured to promote surface recombination of radical species from a plasma source.

5. The showerhead of claim 4, wherein a surface of the body is treated by mechanical roughening.

6. The showerhead of claim 4, wherein the body is formed by material with high recombination coefficient.

7. The showerhead of claim 6, wherein the body is formed by one of aluminum, quartz, anodized aluminum, ceramic, silicon carbide, stainless steel, or combinations thereof.

8. The showerhead of claim 1, wherein the middle portion occupies about 75% of the process surface.

9. An apparatus for processing a substrate, comprising:

a chamber body defining a processing volume;

a substrate support disposed in the processing volume, wherein the substrate support is configured to support the substrate on a backside allowing an edge region of the substrate to be exposed;

an injection nozzle disposed in the processing volume at one side of the substrate support, wherein the injection nozzle is configured to flow a processing gas towards the exposed edge region of the substrate; and a showerhead disposed over the substrate support, wherein the showerhead comprises a body having:

a process surface facing the substrate support, wherein the bottom surface has an outer circular region, a central region, and a middle region between the outer circular region and the central region, a top surface opposing the process surface, a first plurality of holes configured for gas delivery, wherein the first plurality of holes are distributed in the outer circular region of the process surface corresponding to an edge area of a front side of the substrate, a plurality of port region holes distributed in a port region located on a portion of the outer circular region extending radially inward, wherein the portion region is located on of one side of the body and aligned with the injection nozzle, each of the first plurality of holes and the plurality of port region holes is a through hole with a first opening at the bottom surface of the body and a second opening at the top surface of the body, no hole is distributed within a substantial portion of the middle region, and the middle region corresponds to a substantial surface area of the process surface, and a recess surrounded by a side wall extending from the body outside the first plurality of holes.

10. The apparatus of claim 9, wherein the showerhead has a second plurality of holes configured for gas delivery, and the second plurality of holes are distributed in a circular region corresponding to the central area of the bottom surface radially inward to the middle region.

11. The apparatus of claim 10, each of the second plurality of holes is a through hole with a first opening at the bottom surface of the body and a second opening at the top surface of the body.

12. The apparatus of claim 11, wherein the first plurality of holes are evenly distributed along a circle in single row, and the second plurality of holes are evenly distributed along a circle in single row.

13. The apparatus of claim 9, wherein the showerhead is configured to promote surface recombination of radical species from a plasma source.

14. The apparatus of claim 13, wherein a surface of the showerhead is treated by mechanical roughening.

15. The apparatus of claim 13, wherein the showerhead is formed by material with high recombination coefficient.

16. The apparatus of claim 9, wherein the substrate support is configured to expose a portion of the backside of the substrate to the processing volume.

17. The apparatus of claim 9, wherein the injection nozzle is substantially flat and configured to deliver the processing gas to a vertically narrow region corresponding to the edge region of the substrate.

18. The apparatus of claim 17, wherein the injection nozzle comprises one or more injection ports configured to direct a gas flow substantially tangentially to the substrate.

19. The apparatus of claim 9, wherein the injection nozzle comprises:

an input pipe having an input channel; and a nozzle head comprising:

a narrow end connected to the input pipe; and a curved wide end arcing around a portion of the substrate being processed.

20. The apparatus of claim 19, wherein the curved wide end has two or more injection ports in fluid communication with the input channel in the input pipe.

21. A showerhead for gas delivery in a semiconductor processing chamber having an injection nozzle disposed in one side of a processing volume, wherein the injection nozzle is configured to inject a processing gas towards an edge region of a substrate disposed in the semiconductor processing chamber, the showerhead comprising:

a body having:

a process surface configured to face a substrate being processed, wherein the process surface has an outer region, a central region, and a middle region between the outer region and the central region, a top surface opposing the process surface, a side wall surrounding the process surface and defining a recess, a first plurality of holes distributed in the outer region and configured to direct a gas flow towards an edge area of the substrate, a second plurality of holes distributed in the central region, a third plurality of holes distributed in a port region of the middle region, wherein each of the first, second, and third plurality of holes is a through hole with a first opening at the process surface of the body and a second opening at the top surface of the body, the portion region is located on one side of the body and aligned with the injection nozzle, and no hole is distributed within the rest portion of the middle region.

22. The showerhead of claim 21, wherein the first plurality of holes are evenly distributed in the outer region in a single row and the second plurality of holes are evenly distributed in the central region in a single row.

23. The showerhead of claim 22, wherein the middle portion occupies about 75% of the process surface.

24. The showerhead of claim 21, wherein the body is made from material with high recombination coefficient.

25. The showerhead of claim 24, wherein the body is made from aluminum, quartz, anodized aluminum, ceramic, silicon carbide, stainless steel, or combinations thereof.

* * * * *